United States Patent [19]

Maeda et al.

[11] Patent Number: 4,467,275
[45] Date of Patent: Aug. 21, 1984

[54] DC CHARACTERISTICS MEASURING SYSTEM

[75] Inventors: Koichi Maeda; Haruo Ito, both of Tokyo, Japan

[73] Assignee: Hewlett-Packard Company, Palo Alto, Calif.

[21] Appl. No.: 434,657

[22] Filed: Oct. 15, 1982

[30] Foreign Application Priority Data

Oct. 29, 1981 [JP] Japan ................................. 56-173654

[51] Int. Cl.³ .............................................. G01R 15/12
[52] U.S. Cl. .............................. 324/73 AT; 324/158 T
[58] Field of Search ........... 324/73 AT, 73 R, 73 PC, 324/57 R, 158 T, 158 D, 158 R; 307/84

[56] References Cited

U.S. PATENT DOCUMENTS

| 4,039,945 | 8/1977 | Ugolnikov | 324/158 T X |
| 4,044,244 | 8/1977 | Foreman | 324/73 R X |
| 4,055,801 | 10/1977 | Pike | 324/73 AT X |

FOREIGN PATENT DOCUMENTS 56-173654 10/1981 Japan .

OTHER PUBLICATIONS

Hewlett-Packard Journal, Oct. 1982, vol. 33, No. 10.

Primary Examiner—Ernest F. Karlsen
Assistant Examiner—Jose M. Solis
Attorney, Agent, or Firm—Jeffery B. Fromm

[57] ABSTRACT

A novel digitized measuring system is disclosed for the measurement of the DC parameters of a wide variety of electrical and electronic devices. A stimulus measuring unit (SMU) is disclosed which can alternatively act as a voltage source and current monitor or as a current source and voltage monitor. A device under test (DUT) can be characterized without changing external connections and the resulting data can be manipulated and displayed in a wide variety of graphical or tabular forms.

4 Claims, 6 Drawing Figures

DC CHARACTERISTICS MEASURING SYSTEM

BACKGROUND OF THE INVENTION

Various systems have been used for measuring the DC characteristics of both active and passive electrical devices. Conventionally, in such systems a DC current is applied directly to a device and an output DC voltage is measured; or a DC voltage is directly applied and an output DC current is measured.

For measuring the DC characteristics of semiconductor devices the classical measuring instrument is the curve tracer in which a DC voltage (or current) is applied to the device under test (hereinafter referred to as a DUT) and the resulting output current (or voltage) is displayed by means of analog circuitry on a cathode ray tube (CRT). The curve tracer, unfortunately, suffers from several limitations: first, since the results are displayed in analog form on a CRT it is generally difficult to accurately read the displayed data; second, in order to change the type of measurement desired, such as required to measure the various parameters of a transistor, it is necessary to physically alter or exchange the measuring circuit itself; and third, such a system has no means for the direct storage of the measured results.

Generally, in such a conventional system, when automation is desired, a computer is employed for controlling matrix switches which in turn make connection between a plurality of voltage sources, current sources, voltmeters and ammeters and the various terminals of the DUT. Such a system has proven very useful, but is bulky, complex, and expensive. In addition, it has proven difficult to rapidly perform a wide range of desired measurements.

SUMMARY OF THE INVENTION

The primary object of the present invention is to provide a system for measuring the DC characteristics of a DUT with both high resolution and high accuracy. A second objective is to provide a system which is highly flexible and readily adaptable so that a large variety of desired measurements can be made without extensive changes in the measuring circuit. A third objective is to provide a measuring system in which the measured data can be manipulated and displayed as desired by the operator.

The measuring system according to the present invention includes a plurality of measuring units that are connected to the terminals of the DUT. These measuring units include both controllable voltage and current sources, as well as an ammeter and voltmeter which can digitize their respective measured values. The digitized data is then processed in a manner determined by the operator.

DETAILED DESCRIPTION OF THE DRAWINGS

DETAILED DESCRIPTION OF THE INVENTION

Figure 1:
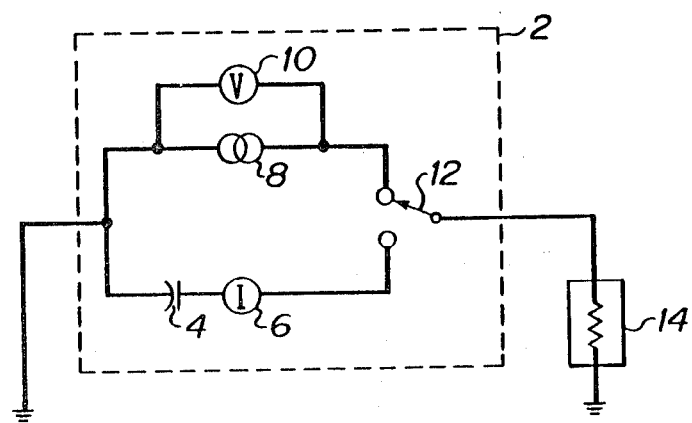
FIG. 1 is a block diagram showing the measuring units used in the measuring system according to the preferred embodiment of the present invention.
Figure 2:
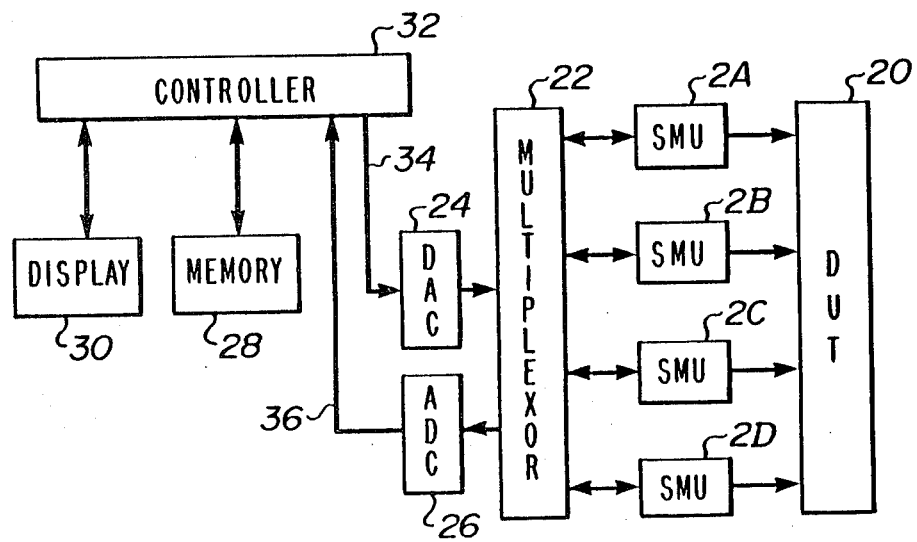
FIG. 2 is a block diagram of the overall construction of a DC characteristic measuring system according to one embodiment of the present invention.

FIG. 1 is a block diagram showing the measuring units used in the system according to the present invention. The measuring unit 2 also called a "Stimulus and Measurement Unit" or SMU includes a series circuit of a variable voltage source 4 and a current measuring circuit 6, a parallel circuit of a variable current source 8 and a voltage measuring circuit 10 and a switch 12 to select between these circuits. The outputs of the variable voltage source 4 and variable current source 8 can be changed by a controller 32 (FIG. 2). The SMU 2 is connected at its output to the object element to be measured 14. In this embodiment the object element 14 may be any of a number of devices such as a resistor, a diode or the like.

FIG. 2 is a block diagram showing the overall construction of the DC characteristics measuring system according to a first embodiment of the present invention, in which four SMUs 2A, 2B, 2C and 2D are connected to the respective terminals of the object elements to be measured 20 (hereinafter referred to as a Device Under Test or DUT). Each SMU 2A to 2D is connected to a digital-to-analog converter 24 (hereinafter referred to as a DAC) and an analog-to-digital converter 26 (hereinafter referred to as a ADC) through a multiplexer 22. The memory 28, display 30, DAC 24 and ADC 26 are each connected to the controller 32.

In order to apply a voltage or current required for a particular measurement to the DUT 20, a SMU setting signal 34 sent out from the controller 32, is converted into an analog signal by the DAC 24, and then applied to the respective SMU 2A to 2D through the multiplexer 22. In addition, the analog voltage and current information measured in the respective SMUs 2A to 2D is sent to the ADC 26 through the multiplexer 22, Thus, the digital signal 36 is transmitted to the controller 32. The digital signal 36 is then stored in the memory 28. At the same time various operator determined computing processes are carried out in controller 32, the results of which are transmitted to display 30.

The SMUs 2A through 2D can also be modified to include the DAC and ADC therein. In this case, the multiplexer 22 can be omitted.

Figures 3, 4:
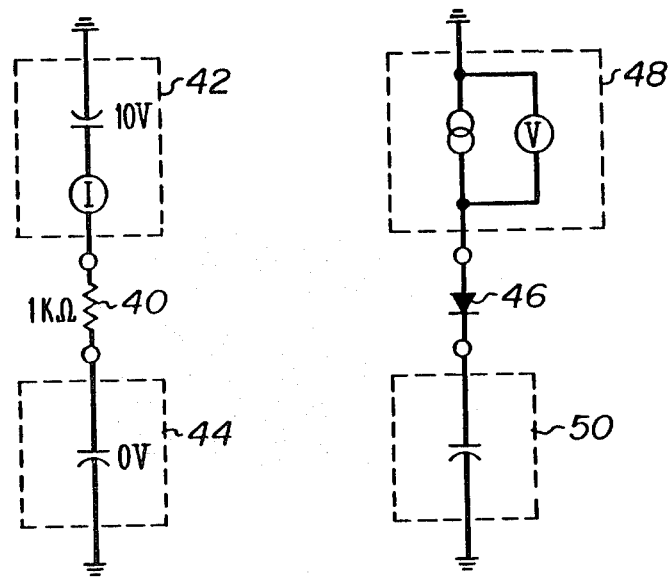
FIGS. 3-5 are schematic views illustrating examples of the connection of a plurality of measuring units to various types of devices to be measured according to the present invention.
Figure 5:
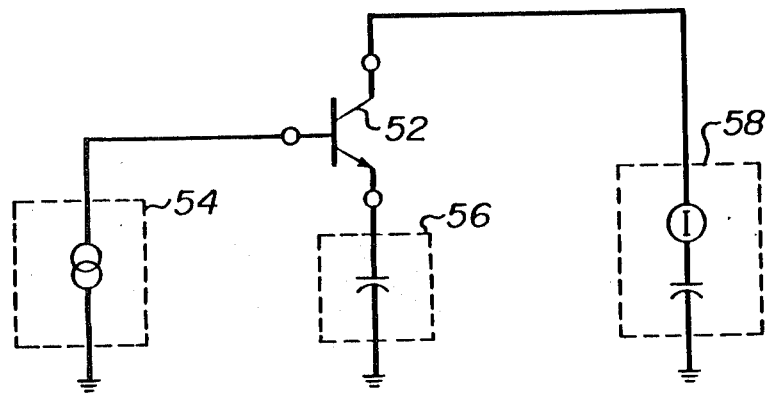

FIGS. 3 through 5 show examples in which the SMUs are connected to various DUTs.

In FIG. 3, one terminal of a resistor under test 40 is connected to SMU 42 and one terminal of resistor under test 40 is connected to SMU 44. In this example, SMU 42 functions as a voltage source generating a constant voltage of, for example, 10 V. At the same time, SMU 44 functions merely as a connecting lead wire since the output voltage of SMU 44 is set to 0 V. Accordingly if, for example, the resistance of the resistor 40 is 1000 ohms, the current measuring circuit included in the SMU 42 generates an analog voltage corresponding to "10 mA".

In FIG. 4, the terminals of the diode 46 are connected to SMUs 48 and 50, respectively. Since the output voltage and output current of SMUs 48 and 50 can be changed as desired, both the forward and backward characteristics of the diode 46 can be measured without changing the connection between the SMUs 48 and 50 and diode 46.

In FIG. 5, three SMUs 54, 56 and 58 are connected to the respective terminals of a transistor 52 for measuring the DC characteristics of the transistor 52. Since the voltage and current applied to each transistor terminal can be changed independently by the setting of the SMUs, it is possible to produce on display 30 (see FIG. 2) graphs which characterize various device parameters. Further, a simple change in the setting of the roles of the SMUs can effect a change in the grounding and operating mode of the transistor 52. For example, in case of the grounded base mode characteristics measurement, the SMU 54 is made to function as a voltage source, the output voltage of which is set at 0 V. In like fashion, if the DUT is changed from an NPN transistor to a PNP transistor, it is only necessary that the polarity of the output setting of the SMUs be changed without any change in the test wiring. Thus, it is possible to electrically characterize a DUT without any external change in the device connections.

Figure 6:
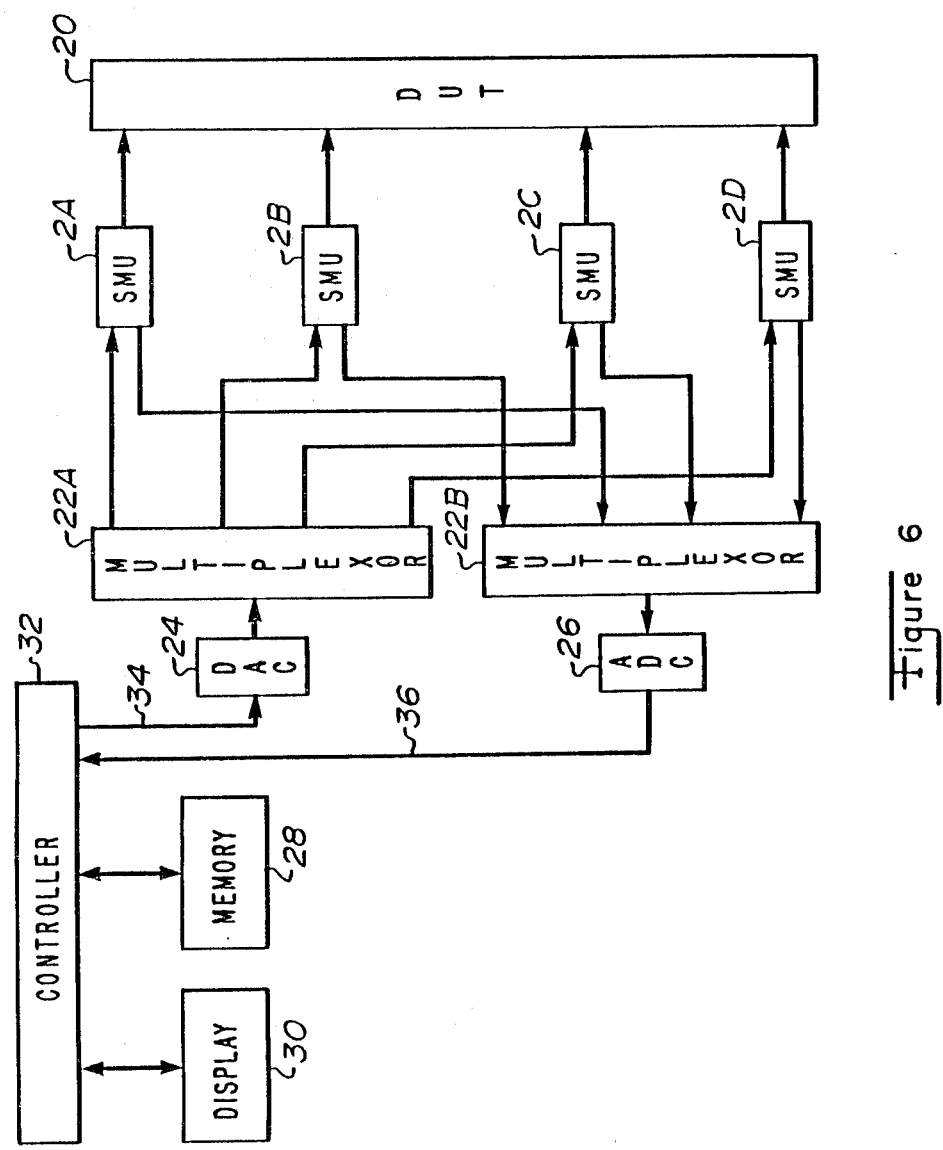
FIG. 6 is a block diagram of the overall construction of a DC characteristic measuring system according to a second embodiment of the present invention.

FIG. 6 is a block diagram showing the DC chracteristic measuring system according to another embodiment of the present invention. This embodiment is different from the one shown in FIG. 2 in that the function of the single multiplexer 22 in FIG. 2 is performed by a pair of multiplexers 22A and 22B. The multiplexer 22A functions as a multiplexer for setting the source values of the SMUs and the multiplexer 22B functions as a multiplexer for the outputs of the meters of the SMUs. The construction of the system of FIG. 6 is the same in the other respects as the system in the FIG. 2.

As described above, the SMUs can be set as required by the controller. Therefore, the connection to each DUT is facilitated, because when a change is desired in the measuring circuit, only the setting of SMUs has to be changed without the necessity of changing the external connection of and to the DUT itself. Thus, additional circuit change-over switches are unnecessary, which improves the reliability and accuracy of the measuring system itself.

Thus, since the data is transferred in digital form, the measurement accuracy of the measuring system depends almost solely on the accuracy of the ADC and DAC. Hence, the measuring system of the present invention can provide a measurement of extremely high accuracy in comparison with conventional analog systems such as a curve tracer.

Further, since the results of the measurements are stored in digital form, the results of the measurement can be manipulated by controller 32 and displayed in a wide variety of graphical or tabular forms. In addition, it is possible to perform various mathematical operations on the data as desired by the operator before the data is displayed. A detailed display of the coordinates and data is also possible by enlarging, shifting, and marking of the graphical or tabular output. Finally, since the data and controller commands are in digital form it is a simple matter to connect the measuring system to various other apparatuses for subsequent processing or external control.

We claim:

1. A system for measuring the DC electrical chracteristics of an electric element, said system comprising:
   a plurality of measuring unit means for electrically stimulating said electrical element and measuring the electrical response of said electrical element thereto, each of said plurality of measuring unit means having
   a variable DC voltage source having a first control input,
   a DC current measuring device connected in series with the variable voltage source,
   a variable DC current source having a second control input,
   a DC voltage measuring device connected in parallel with the variable current source, and
   switch means coupled to the electrical element to be measured, said switch means for selecting between the series combination of the voltage source and current measuring device, and the parallel combination of the current source and the voltage measuring device; and
   a controller means coupled to the plurality of measuring unit means for setting the electrical parameters of said measuring unit means.

2. A system as in claim 1, further comprising analog to digital convertor means coupled to said plurality of measuring unit means for digitizing the values of the current and voltage measuring devices.

3. A system for measuring the DC electrical chracteristics of an electrical element, said system comprising:
   a plurality of measuring unit means for electrically stimulating said electrical element and measuring the electrical response of said electrical element thereto, each of said plurality of measuring unit means having
   a variable DC voltage source having a first control input,
   a DC current measuring device connected in series with the variable voltage source,
   a variable DC current source having a second control input,
   a DC voltage measuring device connected in parallel with the variable current source, and
   switch means coupled to the series combination of the voltage source and current measuring device, and the parallel combination of the current source and the voltage measuring device for selecting which of said series combination of the voltage source and current measuring device or the parallel combination of the current source and the voltage measuring device is coupled to the electrical element to be measured; and
   controller means coupled to the plurality of measuring unit means for setting the electrical parameters of said measuring unit means.

4. A system as in claim 3 further comprising analog to digital convertor means coupled to said plurality of measuring unit means for digitizing the values of the current and voltage measuring devices.

* * * * *